(12) United States Patent
Song et al.

(10) Patent No.: US 12,394,453 B2
(45) Date of Patent: Aug. 19, 2025

(54) MULTI-MODE COMPATIBLE ZQ CALIBRATION CIRCUIT IN MEMORY DEVICE

(71) Applicant: YANGTZE MEMORY TECHNOLOGIES CO., LTD., Wuhan (CN)

(72) Inventors: Hang Song, Wuhan (CN); Daesik Song, Wuhan (CN); Lin Yang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 18/528,395

(22) Filed: Dec. 4, 2023

(65) Prior Publication Data

US 2024/0105238 A1    Mar. 28, 2024

Related U.S. Application Data

(60) Division of application No. 17/483,244, filed on Sep. 23, 2021, now Pat. No. 11,875,873, which is a
(Continued)

(51) Int. Cl.
*G11C 7/10* (2006.01)
*G11C 16/06* (2006.01)

(52) U.S. Cl.
CPC ............ *G11C 7/1048* (2013.01); *G11C 16/06* (2013.01); *G11C 2207/2254* (2013.01)

(58) Field of Classification Search
CPC ............................................. G11C 2207/2254
(Continued)

(56) References Cited

U.S. PATENT DOCUMENTS 9,825,631 B1 * 11/2017 Cho .................. G11C 29/021
2017/0154668 A1    6/2017 Ha
(Continued)

FOREIGN PATENT DOCUMENTS

| CN | 109493901 A | 3/2019 |
| CN | 109817258 A | 5/2019 |
| CN | 110176263 A | 8/2019 |

OTHER PUBLICATIONS

International Search Report issued in corresponding International Application No. PCT/CN2021/082661, mailed Dec. 28, 2021, 4 pages.

*Primary Examiner* — Anthan Tran
(74) *Attorney, Agent, or Firm* — BAYES PLLC

(57) ABSTRACT

In certain aspects, a circuit for multi-mode calibration can include a resistor input. The circuit can also include a first comparator connected to the resistor input and to a first plurality of voltage sources. The circuit can also include a first pull-up driver. The circuit can further include a logic pull-up code generator to calibrate the first pull-up driver. The circuit can additionally include a replica of the first pull-up driver. The circuit can also include a first pull-down driver and a second comparator connected to the replica, the first pull-down driver, and a second plurality of voltage sources. The second comparator can compare a voltage of a middle point between the first pull-down driver and the second pull-up driver to one of the second plurality of voltage sources. The circuit can further include a logic pull-down code generator.

18 Claims, 7 Drawing Sheets

Related U.S. Application Data continuation of application No. PCT/CN2021/082661, filed on Mar. 24, 2021.

(58) Field of Classification Search
USPC .................................................. 365/185.18
See application file for complete search history.

(56) References Cited

U.S. PATENT DOCUMENTS

| | | |
|---|---|---|
| 2017/0162238 A1* | 6/2017 | Lee ..................... G11C 29/021 |
| 2021/0027827 A1 | 1/2021 | Kim et al. |
| 2021/0065803 A1 | 3/2021 | Lee et al. |
| 2021/0242870 A1 | 8/2021 | Kim et al. |

* cited by examiner

500
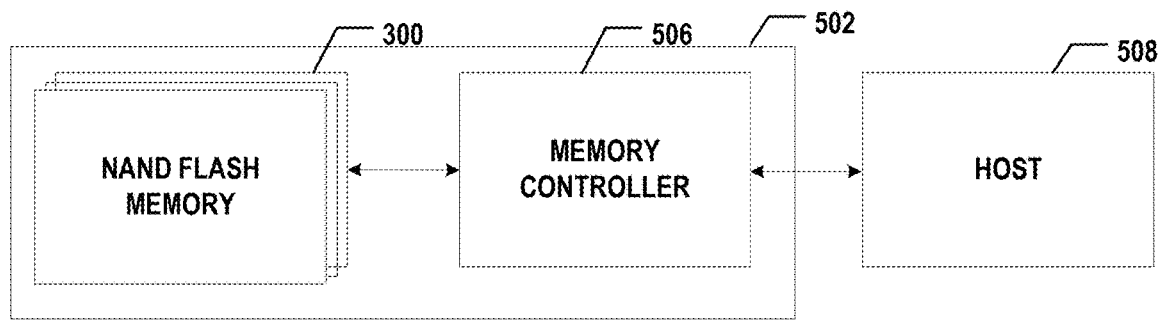
FIG. 5
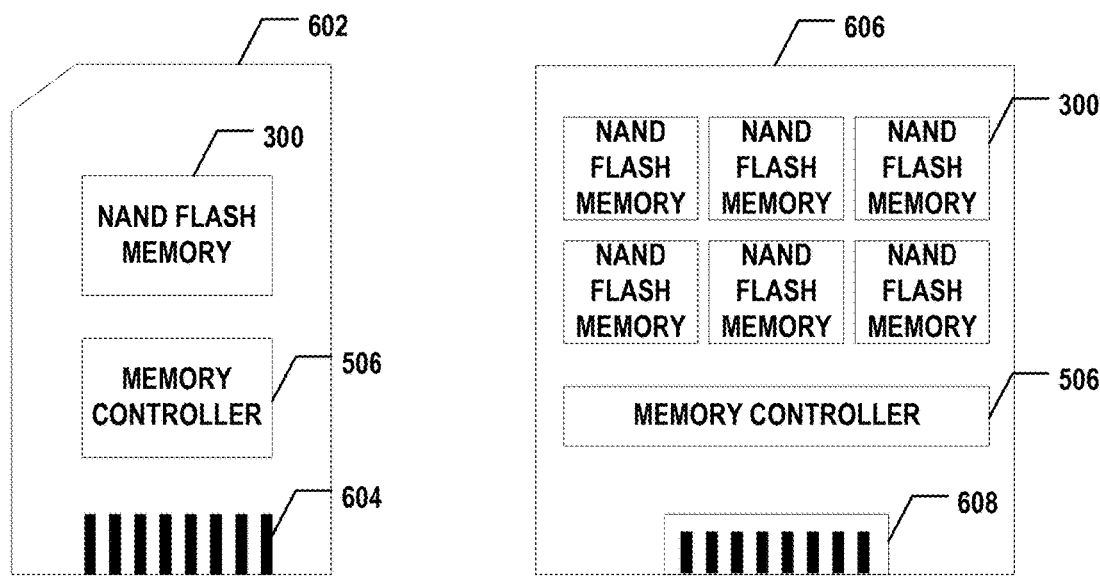
FIG. 6A
FIG. 6B

MULTI-MODE COMPATIBLE ZQ CALIBRATION CIRCUIT IN MEMORY DEVICE

CROSS-REFERENCE TO RELATED APPLICATIONS

This application is a divisional of U.S. application Ser. No. 17/483,244, filed on Sep. 23, 2021, which is a continuation of International Application No. PCT/CN2021/082661, filed on Mar. 24, 2021, entitled "MULTI-MODE COMPATIBLE ZQ CALIBRATION CIRCUIT IN MEMORY DEVICE," both of which are hereby incorporated by reference in their entireties.

BACKGROUND

The present disclosure relates to memory devices and calibration methods thereof.

Flash memory is a low-cost, high-density, non-volatile solid-state storage medium that can be electrically erased and reprogrammed. Flash memory includes NOR Flash memory or NAND Flash memory, named after the NOR and NAND logic gates.

NAND Flash memory can have its data bus operating with double data rate (DDR), transferring data on both the rising and falling edges of the block signal, also known as the toggle mode. Various versions of DDR standards, such as DDR2, DDR3, DDR4, etc., have been introduced to achieve higher bus speed and lower power.

SUMMARY

In one aspect, a circuit for multi-mode calibration can include a resistor input configured to be connected to an external resistor. The circuit can also include a first comparator connected to the resistor input and to a first plurality of voltage sources. The circuit can also include a first pull-up driver configured to be compared to the external resistor using the first comparator. The first comparator can be configured to use one of the first plurality of voltage sources in the comparison. The circuit can further include a logic pull-up code generator configured to calibrate the first pull-up driver based on the first comparator. The circuit can additionally include a second pull-up driver. The second pull-up driver can be configured as a replica of the first pull-up driver and can be calibrated by a same calibration as the first pull-up driver. The circuit can also include a first pull-down driver and a second comparator connected to the second pull-up driver, the first pull-down driver, and a second plurality of voltage sources. The second comparator can be configured to compare a voltage of a middle point between the first pull-down driver and the second pull-up driver to one of the second plurality of voltage sources. The circuit can further include a logic pull-down code generator configured to calibrate the first pull-down driver based on the second comparator.

In another aspect, a circuit for multi-mode calibration can include a first comparator connected to a first plurality of voltage sources. The circuit can also include a first pull-up driver configured to be compared to an external resistor using the first comparator. The first comparator can be configured to use one of the first plurality of voltage sources in the comparison. The circuit can further include a second pull-up driver. The second pull-up driver can be configured as a replica of the first pull-up driver and can be calibrated by a same calibration as the first pull-up driver. The circuit can additionally include a first pull-down driver. The circuit can also include a second comparator connected to the second pull-up driver, the first pull-down driver, and a second plurality of voltage sources. The second comparator can be configured to compare a voltage of a middle point between the first pull-down driver and the second pull-up driver to one of the second plurality of voltage sources.

In still another aspect, a system can include a memory device configured to store data and a memory controller coupled to the memory device and configured to control the memory device. The memory device can include a NAND memory array and a peripheral circuit coupled to the NAND memory array and including a circuit for multi-mode calibration. The circuit for multi-mode calibration can include a first comparator connected to a first plurality of voltage sources. The circuit can also include a first pull-up driver configured to be compared to an external resistor using the first comparator. The first comparator can be configured to use one of the first plurality of voltage sources in the comparison. The circuit can further include a second pull-up driver. The second pull-up driver can be configured as a replica of the first pull-up driver and can be calibrated by a same calibration as the first pull-up driver. The circuit can additionally include a first pull-down driver. The circuit can also include a second comparator connected to the second pull-up driver, the first pull-down driver, and a second plurality of voltage sources. The second comparator can be configured to compare a voltage of a middle point between the first pull-down driver and the second pull-up driver to one of the second plurality of voltage sources.

In yet another aspect, a calibration method can include calibrating a first pull-up driver and a replica of the first pull-up driver based on a comparison to an external resistor. The calibrating the first pull-up driver can be performed according to a first standard using a first comparator. The method can also include calibrating a first pull-down driver based on a comparison to the replica of the first pull-up driver. The calibrating the first pull-down driver can be performed according to the first standard using a second comparator. The method can further include calibrating a second pull-up driver and a replica of the second pull-up driver according to a second standard using the first comparator. The method can additionally include calibrating a second pull-down driver based on a comparison to the replica of the second pull-up driver according to the second standard using the second comparator.

In a further aspect, a memory device can include a NAND memory array and a peripheral circuit coupled to the NAND memory array and including a circuit for multi-mode calibration. The circuit for multi-mode ZQ calibration can include a resistor input configured to be connected to an external resistor. The circuit for multi-mode ZQ calibration can also include a first comparator connected to the resistor input and to a first plurality of voltage sources. The circuit for multi-mode calibration can further include a first pull-up driver configured to be compared to the external resistor using the first comparator. The first comparator can be configured to use one of the first plurality of voltage sources in the comparison. The circuit for multi-mode calibration can additionally include a logic pull-up code generator configured to calibrate the first pull-up driver based on the first comparator. The circuit for multi-mode calibration can also include a second pull-up driver. The second pull-up driver can be configured as a replica of the first pull-up driver and can be calibrated by a same calibration as the first pull-up driver. The circuit for multi-mode calibration can further include a first pull-down driver. The circuit for multi-mode calibration can additionally include a second comparator connected to the second pull-up driver, the first pull-down driver, and a second plurality of voltage sources and configured to compare a voltage of a middle point between the first pull-down driver and the second pull-up driver to one of the second plurality of voltage sources. The circuit for multi-mode calibration can also include a logic pull-down code generator configured to calibrate the first pull-down driver based on the second comparator.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIG. 5 illustrates a block diagram of an exemplary system having a memory device, according to some aspects of the present disclosure.

FIG. 6A illustrates a diagram of an exemplary memory card having a memory device, according to some aspects of the present disclosure.

FIG. 6B illustrates a diagram of an exemplary solid-state drive (SSD) having a memory device, according to some aspects of the present disclosure.

Figure 1:
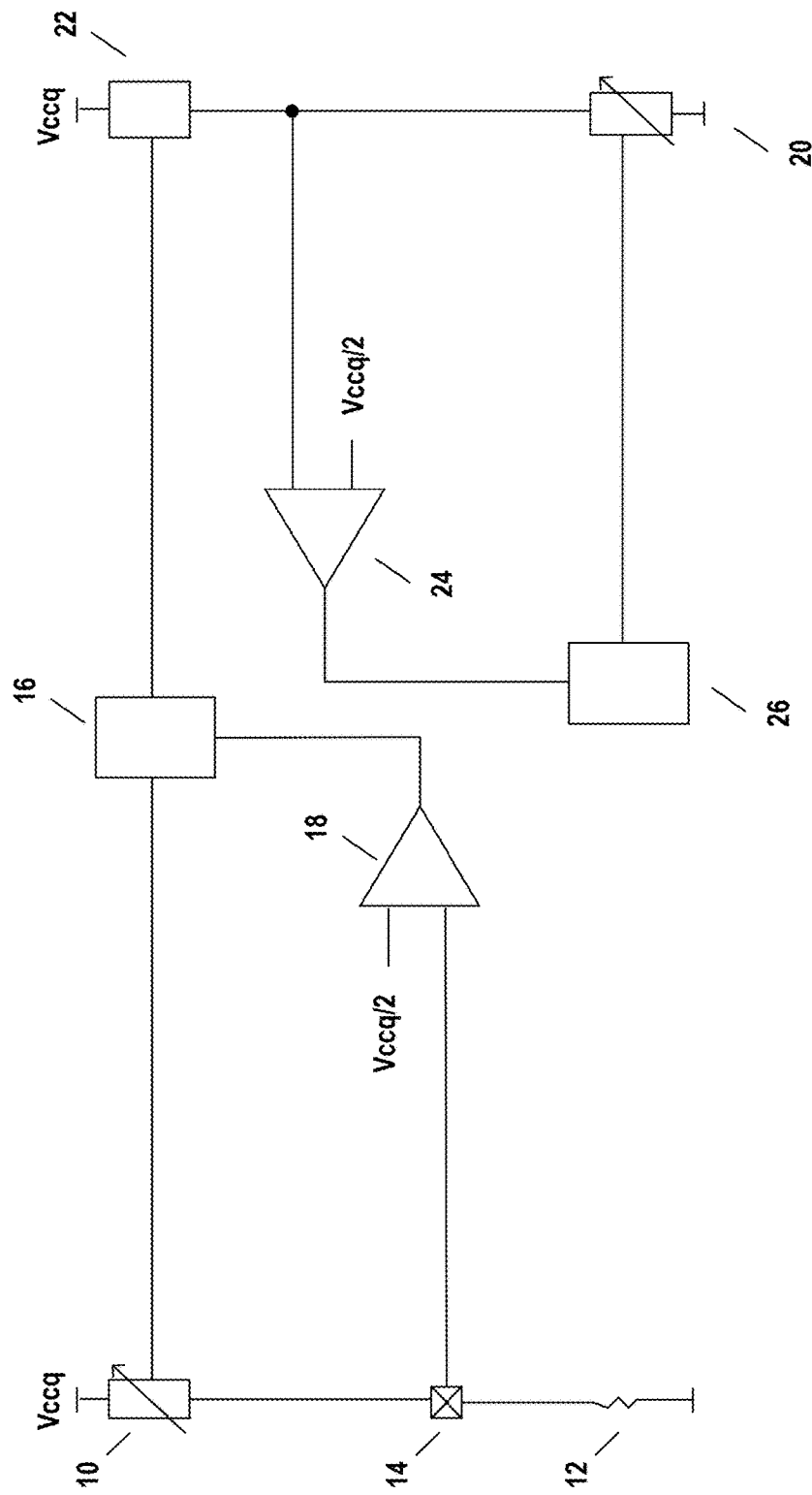
FIG. 1 illustrates double data rate three (DDR3) two-step calibration.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Data pins in a bidirectional bus may be labeled DQ, and the strobe pin may be labeled DQS. With input/output (IO) speed increases, NAND Flash memory is adopting the low-power double data rate four (LPDDR4) IO standard to reduce the power consumption in DQ/DQS output buffers. During the transition period from double data rate three (DDR3) to LPDDR4 standard, a NAND memory device including its ZQ calibration circuit may need to be backward compatible with old DDR3 controllers. ZQ calibration changes the values of on-chip pull-up and pull-down resistors connected to the Vccq/2 pins (a.k.a. ZQ pins).

For example, FIG. 1 illustrates double data rate 3 (DDR3) two-step calibration. A DDR3-type ZQ circuit in a NAND flash memory typically adopts a two-step calibration. In the first step, a pull-up driver 10 is calibrated against an external reference resistor 12 applied to a resistor input 14. Pull-up driver 10 is shown as being calibrated to 300 Ω. External reference resistor 12 is a 300 Ω resistor. The calibration is performed by a logic pull-up code generator 16 based on a comparison made with a first comparator 18. In the second step, a pull-down driver 20 is calibrated against a replica 22 of pull-up driver 10 calibrated in the first step. Both pull-down driver 20 and replica 22 are shown as calibrated to 300 Ω. The calibration is performed by a logic pull-up code generator 26 based on a comparison made with a second comparator 24. The reference voltage of the calibration for each of first comparator 18 and second comparator 24 is half of the supply voltage, namely Vccq/2.

The ZQ calibration circuit of new generation NAND Flash memory may also need to support LPDDR4 mode. As with DDR3, LPDDR4-type ZQ calibration also performs calibration in two steps. For example, FIG. 2A illustrates a first step of an LPDDR4 two-step calibration, while FIG. 2B illustrates a second step of the LPDDR4 two-step calibration.

Figure 2A:
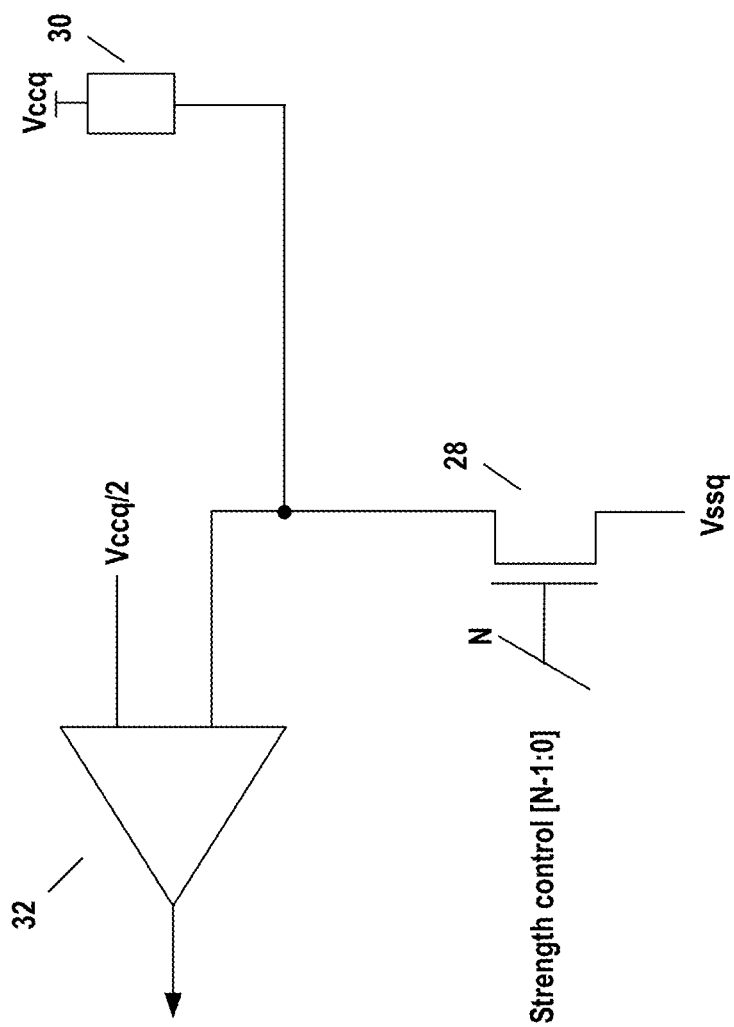
FIG. 2A illustrates a first step of a lower power double data rate four (LPDDR4) two-step calibration.

As shown in FIG. 2A, in the first step, a pull-down driver 28 is calibrated against an external reference resistor 30, which is shown as a 240 Ω resistor connected between Vccq and pull-down driver 28. Pull-down driver 28 can be controlled according to a variable strength control having a strength N, where N can range from a maximum of 1 to a minimum of zero. Strength control may be performed by a circuit that is not shown. The calibration of the strength control for pull-down driver 28 may be based on a comparison using a first comparator 32 with a reference voltage of Vccq/2.

Figure 2B:
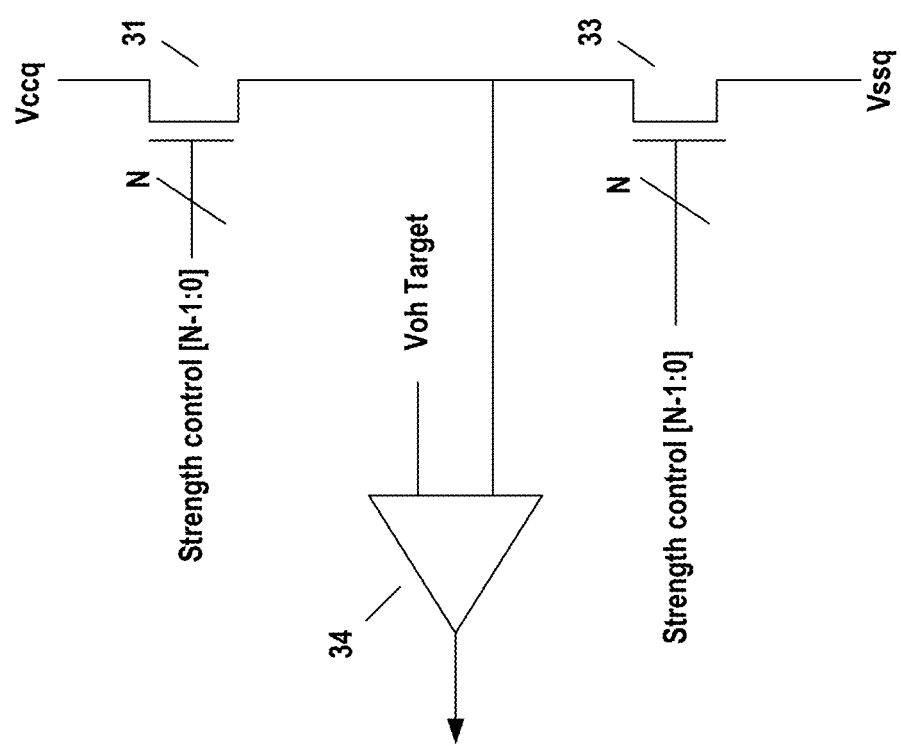
FIG. 2B illustrates a second step of the LPDDR4 two-step calibration.

As shown in FIG. 2B, in the second step, a pull-up driver 31 is calibrated against a replica 33 of pull-down driver 28 (see FIG. 2A) calibrated in the first step. For example, strength control can be applied until the middle point of pull-up driver 31 and pull-down driver 33 reaches a voltage level close to a Voh target used as a reference voltage in a second comparator 34.

Replica 33 could be calibrated to 60 Ω or 120 Ω as examples. For example, calibrated N-type metal-oxide-semiconductor (NMOS) power delivery (PD) control and on-die termination (ODT) information can be used to calibrate replica 33. Replica 33 may be connected between the source voltage Vssq and pull-up driver 31.

However, the current ZQ calibration circuits support either DDR3 standard or LPDDR 4 standard, but not both. During the transition period from DDR3 standard to LPDDR4 standard, a NAND memory device including its ZQ calibration circuit may need to be backward compatible with old DDR3 controllers. To address one or more of the aforementioned issues, certain aspects of the present disclosure introduce an efficient ZQ calibration circuit in a NAND Flash memory that is compatible with both DDR3 and LPDDR4 standards.

Figure 3:
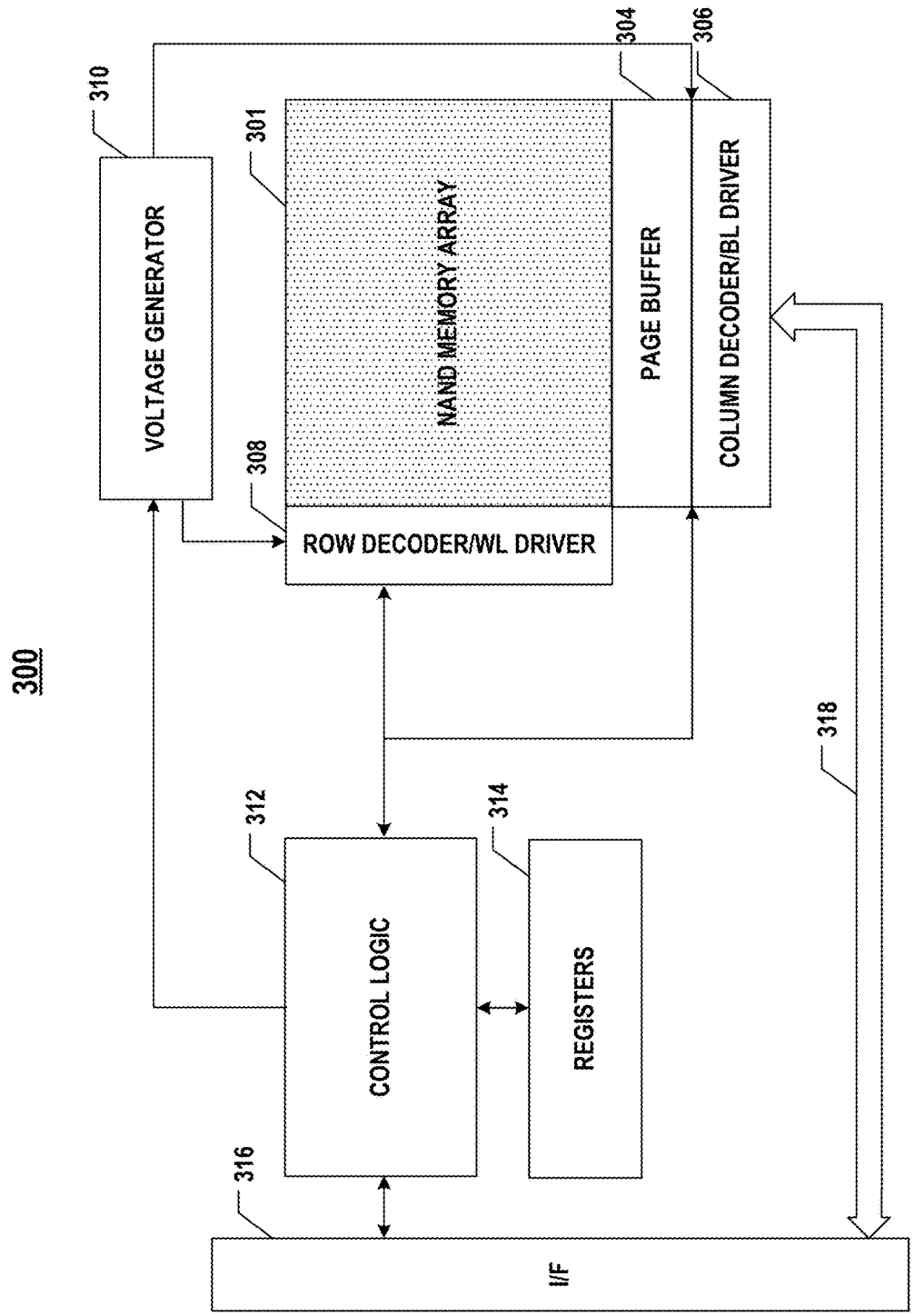
FIG. 3 illustrates a block diagram of an exemplary NAND Flash memory device, according to some aspects of the present disclosure.

FIG. 3 illustrates an exemplary NAND Flash memory 300 compatible with both DDR3 and LPDDR4 standards, according to some aspects of the present disclosure. As shown in FIG. 3, NAND Flash memory 300, such as a three-dimensional (3D) NAND memory, can include a NAND memory array 301 including an array of NAND memory cells in the form of NAND memory strings. NAND Flash memory 300 can also include peripheral circuits configured to facilitate the operations of NAND memory cells, such as read, program, and erase. The peripheral circuits can include, for example, a page buffer 304, a column decoder/bit line driver 306, a row decoder/word line driver 308, a voltage generator 310, control logic 312, registers 314, an interface 316, and a data bus 318. It is understood that in some examples, additional peripheral circuits may be included as well. As described below in detail, a ZQ calibration circuit that is compatible with both DDR3 and LPDDR4 standards can be implemented in any suitable components of NAND Flash memory 300, such as interface 316 and/or data bus 318.

Page buffer 304 can be configured to read and program data from and to NAND memory array 301 according to the control of control logic 312. In one example, page buffer 304 may store one page of program data (write data) to be programmed into one page of NAND memory array 301. In another example, page buffer 304 also performs program verify operations to ensure that the data has been properly programmed into memory cells coupled to selected word lines. Row decoder/word line driver 308 can be configured to be controlled by control logic 312 and select a block of NAND memory array 301 and a word line of the selected block. Row decoder/word line driver 308 can be further configured to drive the selected word line using a word line voltage generated from voltage generator 310. Voltage generator 310 can be configured to be controlled by control logic 312 and generate the word line voltages (e.g., read voltage, program voltage, pass voltage, local voltage, and verification voltage) to be supplied to NAND memory array 301. Column decoder/bit line driver 306 can be configured to be controlled by control logic 312 and select one or more NAND memory strings by applying bit line voltages generated from voltage generator 310. For example, column decoder/bit line driver 306 may apply column signals for selecting a set of N bits of data from page buffer 304 to be outputted in a read operation.

Control logic 312 can be coupled to each peripheral circuit and configured to control operations of peripheral circuits. Registers 314 can be coupled to control logic 312 and include status registers, command registers, and address registers for storing status information, command operation codes (OP codes), and command addresses for controlling the operations of each peripheral circuit.

Interface 316 can be coupled to control logic 312 and act as a control buffer to buffer and relay control commands received from a host (not shown) to control logic 312 and status information received from control logic 312 to the host. Interface 316 can also be coupled to page buffer 304 via column decoder/bit line driver 306 and act as an IO interface and a data buffer to buffer and relay the program data received from a host (not shown) to page buffer 304 and the read data from page buffer 304 to the host. As shown in FIG. 3, bidirectional data bus 318 can connect interface 316 and column decoder/bit line driver 306 for transferring data to and from NAND memory array 301. The multi-mode calibration circuit disclosed herein (e.g., in FIG. 4) may provide calibration to pull-up drivers and pull-down drivers associated with data bus 318 and/or interface 316. The multi-mode calibration circuit may also be used to calibrate other drivers, with these use cases being provided by way of example and illustration and not by way of limitation.

Figure 4:
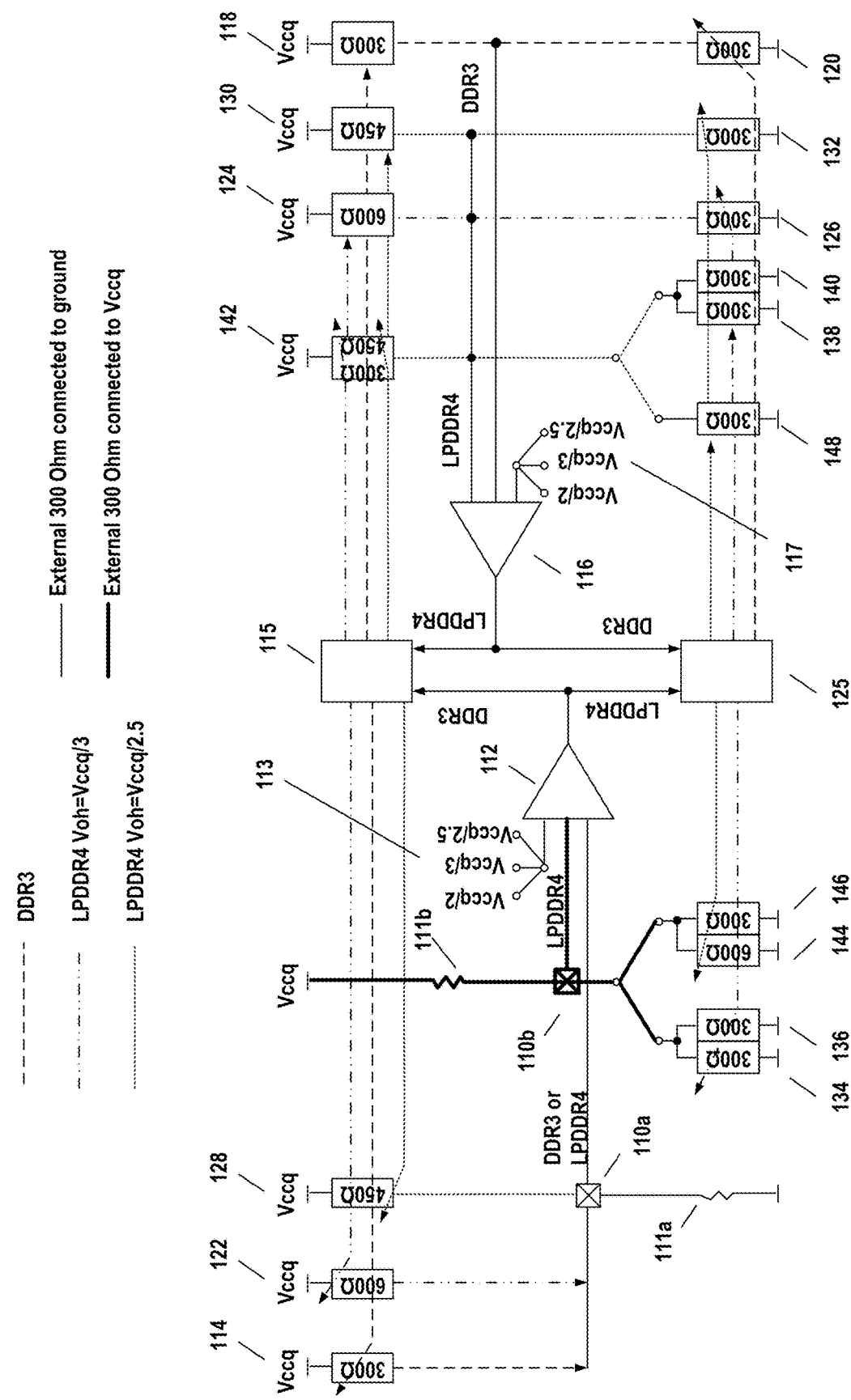
FIG. 4 illustrates a circuit for multi-mode calibration, according to some aspects of the present disclosure.

FIG. 4 illustrates an exemplary circuit for multi-mode calibration, according to some certain aspects of the present disclosure. The circuit shown in FIG. 4 may be used in connection with some components shown in FIG. 3, such as interface 316 and/or data bus 318. FIG. 4 illustrates a combination ZQ calibration circuit compatible with both DDR3 and LPDDR4 standards. In this case, two comparators—a first comparator 112 and a second comparator 116 can be shared between DDR3 and LPDDR4 modes, which may save silicon area. In DDR3 mode, an external 300 Ω reference resistor 111a can be used for the circuit to be compatible with DDR3 standard ZQ calibration.

In DDR3 mode, firstly, a pull-up driver 114 can be calibrated against an external 300 Ω reference resistor 111a connected to the ground. ZQ pad voltage can be fed to first comparator 112. The output of first comparator 112 can be sent to a logic circuit for closed-loop calibration, namely a logic pull-up (PU) code generator 115. In DDR3 mode, after pull-up driver 114 is calibrated, the resulting pull-up code can be sent to a pull-up driver 118, which can be a replica of DDR3 pull-up driver 114, against which a DDR3 pull-down driver 120 can be calibrated. The voltage of the middle point between the replica of DDR3 pull-up driver (namely pull-up driver 118) and DDR3 pull-down driver 120 under calibration can be fed to second comparator 116. The output of second comparator 116 can be sent to a logic circuit for closed-loop calibration, namely a logic pull-down (PD) code generator 125.

In LPDDR4 mode, an external 300 Ω reference resistor 111b can be used for the circuit to be compatible with LPDDR4 standard ZQ calibration. In LPDDR4 mode, firstly, a group of pull-down drivers (for example, a pull-down driver 134 and a pull-down driver 136) can be calibrated against an external 300 Ω reference resistor 111b. The ZQ pad voltage can be fed to the first comparator 112. The output of first comparator 112 is sent to a logic circuit for closed-loop calibration, namely logic pull-up code generator 115.

After the pull-down driver group (for example, pull-down driver 134 and pull-down driver 136) is calibrated, the resulting PD code can be sent to a replica of the LPDDR4 pull-down driver circuit (two 300 Ω pull-down drivers in parallel for Voh target=Vccq/3 case (see, for example, pull-down drivers 138 and 140), and one 300 Ω pull-down driver for Voh target=Vccq/2.5 case (see, for example, pull-down driver 148), against which an LPDDR4 pull-up driver 142 can be calibrated. The voltage of the middle point between the replica of the LPDDR4 pull-down driver and the LPDDR4 pull-up driver 142 under calibration can be fed to second comparator 116. The output of the second comparator 116 can be sent to a logic circuit for closed-loop calibration (for example, logic pull-up code generator 115).

In DDR4 mode, when VOH target=Vccq/3, two 300 Ω pull-down drivers (see, for example, pull-down drivers 134 and 136) in parallel can form a pull-down driver group for more accurate pull-down and pull-up driver Ron calibration with Voh target=Vccq/3. In DDR4 mode, when Voh target=Vccq/3, LPDDR4 pull-up driver 142 can be calibrated to 300 Ω to be fully compatible with LPDDR4 standard. In DDR4 mode, when Voh target=Vccq/2.5, a 300 Ω pull-down driver and a 600 Ω pull-down driver in parallel (see respectively a pull-down driver 146 and a pull-down driver 144) form a pull-down drive group for more accurate pull-down driver Ron calibration. Whereas in pull-up driver calibration, only a single 300 Ω pull-down driver replica may be utilized. In DDR4 mode, when Voh target=Vccq/2.5, pull-up driver 142 can be calibrated to 450 Ω to be fully compatible with LPDDR4 standard.

Thus, more particularly, as shown in FIG. 4, the circuit for multi-mode calibration can include resistor inputs 110*a* or 110*b* (either can be considered a resistor input and the other can be considered a second resistor input) configured to be connected to external resistor 111*a* or external resistor 111*b*. Resistor input 110*b* goes with external resistor 111*b*, while resistor input 111*a* goes with external resistor input 110*a*. External resistor 111*a* may be used either for DDR3 mode ZQ calibration or LPDDR4 mode ZQ calibration. On the other hand, external resistor 111*b* may be connected to Vccq for LPDDR4 mode calibration.

The circuit can also include first comparator 112 connected to the resistor input 110*a* or 110*b* (or both) and to a first plurality of voltage sources 113, respectively labelled Vccq/2, Vccq/3, and Vccq/2.5. The first plurality of voltage sources 113 can be selected for comparison based on the desired Voh target.

First pull-up driver 114 can be configured to be compared to the external resistor 111*a* or external resistor 111*b* using the first comparator 112. First comparator 112 can be configured to use one of the first plurality of voltage sources 113 in the comparison, as explained above. Logic pull-up code generator 115 can be configured to calibrate first pull-up driver 114 based on the comparison provided by first comparator 112.

The circuit can also include a second pull-up driver 118. The second pull-up driver 118 can be configured as a replica of the first pull-up driver 114 and can be calibrated by the same calibration as the first pull-up driver 114. For example, as explained above, codes generated for the first pull-up driver 114 can be used to calibrate second pull-up driver 118.

The circuit can further include first pull-down driver 120 and second comparator 116 connected to second pull-up driver 118, first pull-down driver 120, and a second plurality of voltage sources 117. Second comparator 116 can be configured to compare first pull-down driver 120 with second pull-up driver 118. Second comparator 116 can also be configured to use one of second plurality of voltage sources 117 in the comparison.

The circuit can additionally include logic pull-down code generator 125 configured to calibrate first pull-down driver 120 based on second comparator 116. The circuit can further include a third pull-up driver 122 configured to be compared to external resistor 111*a* or external resistor 111*b* using first comparator 112 and to be calibrated by logic pull-up code generator 115.

The circuit can also include fourth pull-up driver 124 configured as a replica of third pull-up driver 122 and configured to be calibrated by the same calibration as third pull-up driver 122. The circuit can further include second pull-down driver 126. Second pull-down driver 126 can be configured to be compared to fourth pull-up driver 124 using second comparator 116.

Additionally, the circuit can include fifth pull-up driver 128 configured to be compared to external resistor 111*a* or external resistor 111*b* using first comparator 112 and to be calibrated by logic pull-up code generator 115.

The circuit can also include sixth pull-up driver 130 configured as a replica of fifth pull-up driver 128 and configured to be calibrated by the same calibration as fifth pull-up driver 128. Furthermore, the circuit can include third pull-down driver 132. Third pull-down driver 132 can be configured to be compared to sixth pull-up driver 130 using second comparator 116.

The circuit can further include fourth pull-down driver 134 and fifth pull-down driver 136 connected in parallel, configured to be compared to external resistor 111*a* or external resistor 111*b* by first comparator 112, and configured to be calibrated by logic pull-down code generator 125.

The circuit can also include sixth pull-down driver 138 and seventh pull-down driver 140 configured as replicas respectively of fourth pull-down driver 134 and fifth pull-down driver 136 and configured to be calibrated by the same calibration as fourth pull-down driver 134 and fifth pull-down driver 136. Moreover, the circuit can include seventh pull-up driver 142 configured, in a first case (for example, when a Voh target is Vccq/3), to be calibrated by logic pull-up code generator 115 based on a comparison made by second comparator 116 to sixth pull-down driver 138 and seventh pull-down driver 140.

The circuit can further include eighth pull-down driver 144 and ninth pull-down driver 146 connected in parallel, configured to be compared to external resistor 111*a* or external resistor 111*b* by first comparator 112, and configured to be calibrated by logic pull-down code generator 125.

The circuit can also include tenth pull-down driver 148 configured to be a replica of seventh pull-down driver 140 and configured to be calibrated by logic pull-down code generator 125.

In a second case (for example, when a Voh target is Vccq/2.5), seventh pull-up driver 142 can be configured to be calibrated by logic pull-up code generator 115 based on a comparison by second comparator 116 to tenth pull-down driver 148.

The circuit of FIG. 4 can be configured to calibrate according to at least two modes. A first mode of the at least two modes can be a DDR3 mode, while a second mode of the at least two modes can be an LPDDR4 mode. The second mode can be calibrated for a Voh target of Vccq/3 (the first case mentioned above) or for a Voh target of Vccq/2.5 (the second case mentioned above).

The drivers may be various calibrated. For example, pull-up drivers 114 and 118 may be calibrated to 300 Ω, pull-up drivers 122 and 124 may be calibrated to 600 Ω, pull-up drivers 128 and 130 may be calibrated to 450 Ω, while pull-up driver 142 may be calibrated either to 450 Ω or 300 Ω.

Similarly, pull-down drivers 134, 136, 146, 148, 138, 140, 126, 132, and 120 may be calibrated to 300 Ω, while pull-down driver 144 may be calibrated to 600 Ω.

Various modifications to the implementation illustrated in FIG. 4 may be made. More generally, in certain implementations, an external 300 Ω resistor can be connected to ground or Vccq for LPDDR4 mode ZQ calibration for user choice. An external 300 Ω resistor can be connected to the ground for DDR3 mode in order to comply with DDR3 mode ZQ calibration standard. Moreover, certain aspects of the present disclosure may employ only two comparators, thereby saving silicon area.

A pull-up driver can be designed to be calibrated to 300 Ω or 450 Ω to support more LPDDR4 Ron and ODT combinations. Half strength pull-up and pull-down drivers that can be calibrated to 600 Ω can be added to support more LPDDR4 Ron and ODT combinations.

FIG. 5 illustrates a block diagram of an exemplary system 500 having a memory device, according to some aspects of the present disclosure. System 500 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 5, system 500 can include a host 508 and a memory system 502 having one or more NAND Flash memory 300 and a memory controller 506. Host 508 can be a processor of an electronic device, such as a central processing unit (CPU), or a system-on-chip (SoC), such as an application processor (AP). Host 508 can be configured to send or receive the data to or from NAND Flash memory 300.

NAND Flash memory 300, as described above, can include a ZQ calibration circuit that is compatible with both DDR3 and LPDDR 4 standards. The ZQ calibration circuit disclosed herein can be implemented for any suitable components of the peripheral circuits of NAND Flash memory 300, such as interface 316 and/or data bus 318.

Memory controller 506 is coupled to NAND Flash memory 300 and host 508 and is configured to control NAND Flash memory 300, according to some implementations. Memory controller 506 can manage the data stored in NAND Flash memory 300 and communicate with host 508. In some implementations, memory controller 506 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 506 is designed for operating in a high duty-cycle environment SSDs or embedded multi-media-cards (eMMCs) used as data storage for mobile devices, such as smartphones, tablets, laptop computers, etc., and enterprise storage arrays. Memory controller 506 can be configured to control operations of NAND Flash memory 300, such as read, erase, and program operations. Memory controller 506 can also be configured to manage various functions with respect to the data stored or to be stored in NAND Flash memory 300 including, but not limited to bad-block management, garbage collection, logical-to-physical address conversion, wear leveling, etc. In some implementations, memory controller 506 is further configured to process error correction codes (ECCs) with respect to the data read from or written to NAND Flash memory 300. Any other suitable functions may be performed by memory controller 506 as well, for example, formatting NAND Flash memory 300. Memory controller 506 can communicate with an external device (e.g., host 508) according to a particular communication protocol. For example, memory controller 506 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 506 and one or more NAND Flash memory 300 can be integrated into various types of storage devices, for example, be included in the same package, such as a universal Flash storage (UFS) package or an eMMC package. That is, memory system 502 can be implemented and packaged into different types of end electronic products. In one example as shown in FIG. 6A, memory controller 506 and a single NAND Flash memory 300 may be integrated into a memory card 602. Memory card 602 can include a PC card (PCMCIA, personal computer memory card international association), a CF card, a smart media (SM) card, a memory stick, a multimedia card (MMC, RS-MMC, MMC-micro), an SD card (SD, miniSD, microSD, SDHC), a UFS, etc. Memory card 602 can further include a memory card connector 604 coupling memory card 602 with a host (e.g., host 508 in FIG. 5). In another example as shown in FIG. 6B, memory controller 506 and multiple NAND Flash memory 300 may be integrated into an SSD 606. SSD 606 can further include an SSD connector 608 coupling SSD 606 with a host (e.g., host 508 in FIG. 5). In some implementations, the storage capacity and/or the operation speed of SSD 606 is greater than those of memory card 602.

Figure 7:
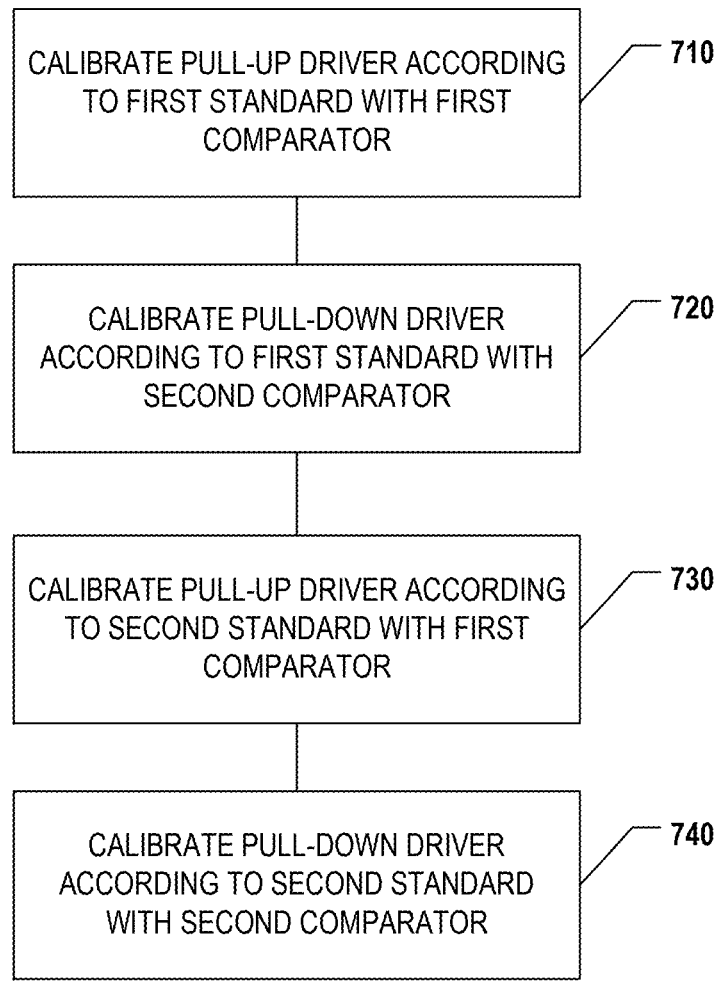
FIG. 7 illustrates a flow chart of an exemplary calibration method, according to some aspects of the present disclosure.

FIG. 7 illustrates a flow chart of an exemplary calibration method according to some aspects of the present disclosure. Certain embodiments may permit re-use of the same comparators for multiple standards. As mentioned above, the different standards may rely on different measurement values and different combinations of pull-up and pull-down drivers. In the following example, one pull-up driver and one pull-down driver are calibrated according to each standard, but numerous such drivers can be calibrated, with FIG. 4 illustrating a number of options.

As shown in FIG. 7, the method can include, at 710, calibrating a first pull-up driver and a replica of the first pull-up driver based on a comparison to an external resistor. The calibrating the first pull-up driver at 710 can be performed according to a first standard using a first comparator. The method can also include, at 720, calibrating a first pull-down driver based on a comparison to the replica of the first pull-up driver. The calibrating the first pull-down driver at 720 can be performed according to the first standard using a second comparator. The method can further include, at 730, calibrating a second pull-up driver and a replica of the second pull-up driver according to a second standard using the first comparator. The method can additionally include, at 740 calibrating a second pull-down driver based on a comparison to the replica of the second pull-up driver according to the second standard using the second comparator. The first standard can be DDR3, and the second standard can be LPDDR4. This method may be similarly extended to each of the calibrations described with reference to FIG. 4, with the illustrated calibrations being provided by way of example. Modifications to the calibration method and associated devices are permitted.

According to one aspect of the present disclosure, a circuit for multi-mode calibration can include a resistor input configured to be connected to an external resistor. The circuit can also include a first comparator connected to the resistor input and to a first plurality of voltage sources. The circuit can also include a first pull-up driver configured to be compared to the external resistor using the first comparator. The first comparator can be configured to use one of the first plurality of voltage sources in the comparison. The circuit can further include a logic pull-up code generator configured to calibrate the first pull-up driver based on the first comparator. The circuit can additionally include a second pull-up driver. The second pull-up driver can be configured as a replica of the first pull-up driver and can be calibrated by a same calibration as the first pull-up driver. The circuit can also include a first pull-down driver and a second comparator connected to the second pull-up driver, the first pull-down driver, and a second plurality of voltage sources. The second comparator can be configured to compare a voltage of a middle point between the first pull-down driver and the second pull-up driver to one of the second plurality of voltage sources. The circuit can further include a logic pull-down code generator configured to calibrate the first pull-down driver based on the second comparator.

In some implementations, the circuit can further include a third pull-up driver configured to be compared to the external resistor using the first comparator and to be calibrated by the logic pull-up code generator.

In some implementations, the circuit can further include a fourth pull-up driver configured as a replica of the third pull-up driver and to be calibrated by a same calibration as the third pull-up driver.

In some implementations, the circuit can further include a second pull-down driver. The second pull-down driver can be configured to be compared to the fourth pull-up driver using the second comparator.

In some implementations, the circuit can further include a fifth pull-up driver configured to be compared to the external resistor using the first comparator and to be calibrated by the logic pull-up code generator.

In some implementations, the circuit can further include a sixth pull-up driver configured as a replica of the fifth pull-up driver and to be calibrated by a same calibration as the fifth pull-up driver.

In some implementations, the circuit can further include a third pull-down driver. The third pull-down driver can be configured to be compared to the sixth pull-up driver using the second comparator.

In some implementations, the circuit can further include a fourth pull-down driver and a fifth pull-down driver connected in parallel, configured to be compared to the external resistor by the first comparator, and configured to be calibrated by the logic pull-down code generator.

In some implementations, the circuit can further include a sixth pull-down driver and a seventh pull-down driver configured as replicas respectively of the fourth pull-down driver and the fifth pull-down driver and configured to be calibrated by a same calibration as the fourth pull-down driver and the fifth pull-down driver.

In some implementations, the circuit can further include a seventh pull-up driver configured, in a first case, to be calibrated by the logic pull-up code generator based on a comparison made by the second comparator to the sixth pull-down driver and the seventh pull-down driver.

In some implementations, the circuit can further include an eighth pull-down driver and a ninth pull-down driver connected in parallel, configured to be compared to the external resistor by the first comparator, and configured to be calibrated by the logic pull-down code generator.

In some implementations, the circuit can further include a tenth pull-down driver configured to be a replica of the seventh pull-down driver and configured to be calibrated by the logic pull-down code generator.

In some implementations, in a second case, the seventh pull-up driver can be configured to be calibrated by the logic pull-up code generator based on a comparison by the second comparator to the tenth pull-down driver.

In some implementations, the circuit can be configured to calibrate according to at least two modes.

In some implementations, a first mode of the at least two modes can be a DDR3 mode.

In some implementations, a second mode of the at least two modes can be an LPDDR4 mode.

In some implementations, the second mode can be calibrated for a Voh target of Vccq/3.

In some implementations, the second mode can be calibrated for a Voh target of Vccq/2.5.

In some implementations, the external resistor can be connected to ground.

In some implementations, the external resistor can be connected to Vccq.

According to another aspect of the present disclosure, a circuit for multi-mode calibration can include a first comparator connected to a first plurality of voltage sources. The circuit can also include a first pull-up driver configured to be compared to an external resistor using the first comparator. The first comparator can be configured to use one of the first plurality of voltage sources in the comparison. The circuit can further include a second pull-up driver. The second pull-up driver can be configured as a replica of the first pull-up driver and can be calibrated by a same calibration as the first pull-up driver. The circuit can additionally include a first pull-down driver. The circuit can also include a second comparator connected to the second pull-up driver, the first pull-down driver, and a second plurality of voltage sources. The second comparator can be configured to compare a voltage of a middle point between the first pull-down driver and the second pull-up driver to one of the second plurality of voltage sources.

In some implementations, the circuit can further include a logic pull-up code generator configured to calibrate the first pull-up driver and the second pull-up driver based on the comparison by the first comparator.

In some implementations, the circuit can further include a logic pull-down code generator configured to calibrate the first pull-down driver based on the comparison by the second comparator.

According to yet another aspect of the present disclosure, a system can include a memory device configured to store data and a memory controller coupled to the memory device and configured to control the memory device. The memory device can include a NAND memory array and a peripheral circuit coupled to the NAND memory array and including a circuit for multi-mode calibration. The circuit for multi-mode calibration can include a first comparator connected to a first plurality of voltage sources. The circuit can also include a first pull-up driver configured to be compared to an external resistor using the first comparator. The first comparator can be configured to use one of the first plurality of voltage sources in the comparison. The circuit can further include a second pull-up driver. The second pull-up driver can be configured as a replica of the first pull-up driver and can be calibrated by a same calibration as the first pull-up driver. The circuit can additionally include a first pull-down driver. The circuit can also include a second comparator connected to the second pull-up driver, the first pull-down driver, and a second plurality of voltage sources. The second comparator can be configured to compare a voltage of a middle point between the first pull-down driver and the second pull-up driver to one of the second plurality of voltage sources.

In some implementations, the system can further include a host coupled to the memory controller and configured to send or receive the data.

In some implementations, the memory device includes a 3D NAND memory.

According to yet another aspect of the present disclosure, a calibration method can include calibrating a first pull-up driver and a replica of the first pull-up driver based on a comparison to an external resistor. The calibrating the first pull-up driver can be performed according to a first standard using a first comparator. The method can also include calibrating a first pull-down driver based on a comparison to the replica of the first pull-up driver. The calibrating the first pull-down driver can be performed according to the first standard using a second comparator. The method can further include calibrating a second pull-up driver and a replica of the second pull-up driver according to a second standard using the first comparator. The method can additionally include calibrating a second pull-down driver based on a comparison to the replica of the second pull-up driver according to the second standard using the second comparator.

In some implementations, the first standard can be DDR3, and the second standard can be LPDDR4.

According to a further aspect of the present disclosure, a memory device can include a NAND memory array and a peripheral circuit coupled to the NAND memory array and including a circuit for multi-mode calibration. The circuit for multi-mode ZQ calibration can include a resistor input configured to be connected to an external resistor. The circuit for multi-mode ZQ calibration can also include a first comparator connected to the resistor input and to a first plurality of voltage sources. The circuit for multi-mode calibration can further include a first pull-up driver configured to be compared to the external resistor using the first comparator. The first comparator can be configured to use one of the first plurality of voltage sources in the comparison. The circuit for multi-mode calibration can additionally include a logic pull-up code generator configured to calibrate the first pull-up driver based on the first comparator. The circuit for multi-mode calibration can also include a second pull-up driver. The second pull-up driver can be configured as a replica of the first pull-up driver and can be calibrated by a same calibration as the first pull-up driver. The circuit for multi-mode calibration can further include a first pull-down driver. The circuit for multi-mode calibration can additionally include a second comparator connected to the second pull-up driver, the first pull-down driver, and a second plurality of voltage sources and configured to compare a voltage of a middle point between the first pull-down driver and the second pull-up driver to one of the second plurality of voltage sources. The circuit for multi-mode calibration can also include a logic pull-down code generator configured to calibrate the first pull-down driver based on the second comparator.

In some implementations, the circuit for multi-mode ZQ calibration can further include a third pull-up driver configured to be compared to the external resistor using the first comparator and to be calibrated by the logic pull-up code generator.

In some implementations, the circuit for multi-mode ZQ calibration can further include a fourth pull-up driver configured as a replica of the third pull-up driver and to be calibrated by a same calibration as the third pull-up driver.

In some implementations, the circuit for multi-mode ZQ calibration can further include a second pull-down driver. The second pull-down driver can be configured to be compared to the fourth pull-up driver using the second comparator.

In some implementations, the circuit for multi-mode ZQ calibration can further include a fifth pull-up driver configured to be compared to the external resistor using the first comparator and to be calibrated by the logic pull-up code generator.

In some implementations, the circuit for multi-mode ZQ calibration can further include a sixth pull-up driver configured as a replica of the fifth pull-up driver and to be calibrated by a same calibration as the fifth pull-up driver.

In some implementations, the circuit for multi-mode ZQ calibration can further include a third pull-down driver. The third pull-down driver can be configured to be compared to the sixth pull-up driver using the second comparator.

In some implementations, the circuit for multi-mode ZQ calibration can further include a fourth pull-down driver and a fifth pull-down driver connected in parallel, configured to be compared to the external resistor by the first comparator, and configured to be calibrated by the logic pull-down code generator.

In some implementations, the circuit for multi-mode ZQ calibration can further include a sixth pull-down driver and a seventh pull-down driver configured as replicas respectively of the fourth pull-down driver and the fifth pull-down driver and configured to be calibrated by a same calibration as the fourth pull-down driver and the fifth pull-down driver.

In some implementations, the circuit for multi-mode ZQ calibration can further include a seventh pull-up driver configured, in a first case, to be calibrated by the logic pull-up code generator based on a comparison made by the second comparator to the sixth pull-down driver and the seventh pull-down driver.

In some implementations, the circuit for multi-mode ZQ calibration can further include an eighth pull-down driver and a ninth pull-down driver connected in parallel, configured to be compared to the external resistor by the first comparator, and configured to be calibrated by the logic pull-down code generator.

In some implementations, the circuit for multi-mode ZQ calibration can further include a tenth pull-down driver configured to be a replica of the seventh pull-down driver and configured to be calibrated by the logic pull-down code generator.

In some implementations, in a second case, the seventh pull-up driver can be configured to be calibrated by the logic pull-up code generator based on a comparison by the second comparator to the tenth pull-down driver.

In some implementations, the circuit for multi-mode ZQ calibration can be configured to calibrate according to at least two modes.

In some implementations, a first mode of the at least two modes can be a DDR3 mode.

In some implementations, a second mode of the at least two modes can be an LPDDR4 mode.

In some implementations, the second mode can be calibrated for a Voh target of Vccq/3.

In some implementations, the second mode can be calibrated for a Voh target of Vccq/2.5.

In some implementations, the external resistor can be connected to ground or Vccq.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A method for ZQ calibration, comprising:
   according to a first double rate data (DDR) standard comprising a DDR3 mode, the method comprising:
   comparing a first voltage of a first resistor input with a first voltage of a first selectable voltage source by a first comparator;

comparing a first voltage of a first middle point with a first voltage of a second selectable voltage source by a second comparator;
calibrating a first pull-up driver based on a first comparison of the first comparator, wherein the first pull-up driver connected to the first resistor input; and
calibrating a first pull-down driver based on a second comparison of the second comparator, wherein the first pull-down driver connected to the first middle point; and
according to a second DDR standard different from the first DDR standard and comprising an LPDDR4 mode, the method comprising:
comparing a second voltage of the first resistor input with a second voltage of the first selectable voltage source by the first comparator, wherein the second voltage of the first selectable voltage source is different from the first voltage of the first selectable voltage source;
comparing a second voltage of a second middle point with a second voltage of the second selectable voltage source by the second comparator, wherein the second voltage of the second selectable voltage source is different from the first voltage of the second selectable voltage source;
calibrating a second pull-up driver based on a third comparison of the first comparator, wherein the second pull-up driver connected to the first resistor input; and
calibrating a second pull-down driver based on a fourth comparison of the second comparator, wherein the second pull-down driver connected to the second middle point.

2. The method of claim 1, wherein according to the first DDR standard, the method further comprises:
transmitting the first comparison of the first comparator to a logic pull-up code generator, wherein the logic pull-up code generator is configured to generate pull-up code to calibrate the first pull-up driver; and
transmitting the second comparison of the second comparator to a logic pull-down code generator, wherein the logic pull-down code generator is configured to generate pull-down code to calibrate the first pull-down driver.

3. The method of claim 2, wherein comparing the first voltage of the first middle point with the first voltage of the second selectable voltage source by the second comparator occurs after calibrating the first pull-up driver, and comparing the second voltage of the second middle point with the second voltage of the second selectable voltage source by the second comparator occurs after calibrating the second pull-up driver.

4. The method of claim 1, wherein according to the second DDR standard, the method further comprises:
transmitting the third comparison of the first comparator to a logic pull-up code generator, wherein the logic pull-up code generator is configured to generate pull-up code to calibrate the second pull-up driver; and
transmitting the fourth comparison of the second comparator to a logic pull-down code generator, wherein the logic pull-down code generator is configured to generate pull-down code to calibrate the second pull-down driver.

5. The method of claim 1, wherein according to the first DDR standard, the method further comprises:
calibrating a third pull-up driver during calibrating the first pull-up driver, the third pull-up driver being a replica of the first pull-up driver, the first middle point being connected with the third pull-up driver and the first pull-down driver.

6. The method of claim 1, wherein according to the second DDR standard, the method further comprises:
calibrating a fourth pull-up driver during calibrating the second pull-up driver, the fourth pull-up driver being a replica of the second pull-up driver, the second middle point being connected with the fourth pull-up driver and the second pull-down driver.

7. The method of claim 1, wherein the first voltage of the first selectable voltage source is the same as the first voltage of the second selectable voltage source, and the second voltage of the first selectable voltage source is the same as the second voltage of the second selectable voltage source.

8. The method of claim 1, wherein the first DDR standard is calibrated for a Voh target of Vccq/2, and the second DDR standard is calibrated for a Voh target of Vccq/3 or Vccq/2.5.

9. The method of claim 1, further comprising:
according to the second DDR standard, the method comprises:
comparing a first voltage of a second resistor input with a third voltage of the first selectable voltage source by the first comparator;
comparing a third voltage of a third middle point with a third voltage of the second selectable voltage source by the second comparator;
calibrating a third pull-down driver based on a fifth comparison of the first comparator, wherein the third pull-down driver connected to the second resistor input; and
calibrating a fifth pull-up driver based on a sixth comparison of the second comparator, wherein the fifth pull-up driver connected to the third middle point.

10. The method of claim 9, wherein the first DDR standard comprises a DDR3 mode, the second DDR standard comprises a LPDDR4 mode.

11. The method of claim 9, wherein according to the second DDR standard, the method further comprises:
calibrating a fourth pull-down driver during calibrating the third pull-down driver, wherein the fourth pull-down driver is a replica of the third pull-down driver, wherein the third middle point connected with the fourth pull-down driver and the fifth pull-up driver.

12. The method of claim 9, wherein an end of the first resistor input is connected with a first external resistor, an end of the second resistor input is connected with a second external resistor, the first external resistor is connected to ground, and the second external resistor is connected to Vccq.

13. A method for ZQ calibration, comprising:
according to a first double rate data (DDR) standard comprising a DDR3 mode, the method comprising:
comparing a first voltage of a first resistor input with a first voltage of a first selectable voltage source by a first comparator;
comparing a first voltage of a first middle point with a first voltage of a second selectable voltage source by a second comparator;
calibrating a first pull-up driver based on a first comparison of the first comparator, wherein the first pull-up driver connected to the first resistor input; and calibrating a first pull-down driver based on a second comparison of the second comparator, wherein the first pull-down driver connected to the first middle point; and according to a second DDR standard different from the first DDR standard and comprising an LPDDR4 mode, the method comprising:

comparing a first voltage of a second resistor input with a second voltage of the first selectable voltage source by the first comparator;

comparing a second voltage of a second middle point with a second voltage of the second selectable voltage source by the second comparator;

calibrating a second pull-down driver based on a third comparison of the first comparator, wherein the second pull-down driver connected to the second resistor input; and calibrating a second pull-up driver based on a fourth comparison of the second comparator, wherein the second pull-up driver connected to the second middle point.

14. The method of claim 13, wherein according to the second DDR standard, the method further comprises:

transmitting the third comparison of the first comparator to a logic pull-down code generator, wherein the logic pull-down code generator is configured to generate pull-down code to calibrate the second pull-down driver; and transmitting the fourth comparison of the second comparator to a logic pull-up code generator, wherein the logic pull-up code generator is configured to generate pull-up code to calibrate the second pull-up driver, wherein comparing the second voltage of the second middle point with the second voltage of the second selectable voltage source by the second comparator after calibrating the second pull-down driver.

15. The method of claim 13, wherein according to the first DDR standard, the method further comprises:

transmitting the first comparison of the first comparator to a logic pull-up code generator, wherein the logic pull-up code generator is configured to generate pull-up code to calibrate the first pull-up driver; and transmitting the second comparison of the second comparator to a logic pull-down code generator, wherein the logic pull-down code generator is configured to generate pull-down code to calibrate the first pull-down driver, wherein comparing the first voltage of the first middle point with the first voltage of the second selectable voltage source by the second comparator after calibrating the first pull-up driver.

16. The method of claim 13, wherein according to the second DDR standard, the method further comprising:

calibrating a third pull-down driver during calibrating the second pull-down driver, wherein the third pull-down driver is a replica of the second pull-down driver.

17. The method of claim 13, wherein an end of the first resistor input connected with a first external resistor, an end of the second resistor input connected with a second external resistor, the first external resistor is connected to ground, the second external resistor is connected to Vccq.

18. A memory system, comprising:

a memory device configured to store data, the memory device comprising:

a memory array; and a peripheral circuit coupled to the memory array and comprising a circuit for multi-mode ZQ calibration, the circuit for multi-mode ZQ calibration is configured to:

according to a first double rate data (DDR) standard comprising a DDR3 mode, the circuit for multi-mode ZQ calibration is configured to:

comparing a first voltage of a first resistor input with a first voltage of a first selectable voltage source by a first comparator;

comparing a first voltage of a first middle point with a first voltage of a second selectable voltage source by a second comparator;

calibrating a first pull-up driver based on a first comparison of the first comparator, wherein the first pull-up driver connected to the first resistor input; and calibrating a first pull-down driver based on a second comparison of the second comparator, wherein the first pull-down driver connected to the first middle point; and according to a second DDR standard different from the first DDR standard and comprising an LPDDR4 mode, the circuit for multi-mode ZQ calibration is configured to:

comparing a first voltage of a second resistor input with a second voltage of the first selectable voltage source by the first comparator;

comparing a second voltage of a second middle point with a second voltage of the second selectable voltage source by the second comparator;

calibrating a second pull-down driver based on a third comparison of the first comparator, wherein the second pull-down driver connected to the second resistor input; and calibrating a second pull-up driver based on a fourth comparison of the second comparator, wherein the second pull-up driver connected to the second middle point.

* * * * *